United States Patent [19]
Sugano

[11] Patent Number: 6,060,924
[45] Date of Patent: May 9, 2000

[54] SEMICONDUCTOR INTEGRATED CIRCUIT WHICH CONTAINS SCAN CIRCUITS OF DIFFERENT TYPES

[75] Inventor: Hiroaki Sugano, Yokohama, Japan

[73] Assignee: Fujitsu Limited, Kawasaki, Japan

[21] Appl. No.: 09/059,704

[22] Filed: Apr. 14, 1998

[30] Foreign Application Priority Data

Nov. 6, 1997 [JP] Japan ................................. 9-304137

[51] Int. Cl.[7] ................................................ H03K 3/289
[52] U.S. Cl. .......................... 327/202; 327/213; 327/141
[58] Field of Search ................................. 327/202, 203, 327/213, 141; 377/64, 66; 714/726

[56] References Cited

U.S. PATENT DOCUMENTS

| | | | |
|---|---|---|---|
| 5,646,567 | 7/1997 | Felix ........................................ | 327/202 |
| 5,668,492 | 9/1997 | Pedersen et al. ....................... | 327/291 |
| 5,774,003 | 6/1998 | Qureshi et al. ......................... | 327/202 |
| 5,774,475 | 6/1998 | Qureshi .................................. | 371/22.31 |

FOREIGN PATENT DOCUMENTS 8-114647  5/1996  Japan .

*Primary Examiner*—Toan Tran
*Assistant Examiner*—Hai L. Nguyen
*Attorney, Agent, or Firm*—Staas & Halsey LLP

[57] ABSTRACT

A semiconductor integrated circuit includes a first shift register composed of a plurality of first flipflops each including a first selector for selecting a first or second clock, a second selector for selecting an inverted signal of the first clock or a third clock, a third selector for selecting a first data signal or a first scanning signal, a first latch circuit for latching an output of the third selector, and a second latch circuit for latching an output of the first latch circuit. The semiconductor integrated circuit further includes a second shift register composed of a plurality of second flipflops each including a fourth selector for selecting a second data signal or a second scanning signal, a third latch circuit for latching an output of the fourth selector, and a fourth latch circuit for latching an output signal of the third latch circuit.

7 Claims, 4 Drawing Sheets

SEMICONDUCTOR INTEGRATED CIRCUIT WHICH CONTAINS SCAN CIRCUITS OF DIFFERENT TYPES

BACKGROUND OF THE INVENTION

1. Field of the Invention

This invention relates to a semiconductor integrated circuit formed on a semiconductor chip, and more particularly to a construction of flipflops of a semiconductor integrated circuit.

2. Description of the Related Art

Since a plurality of flipflops are used for a counter, a register or a like element on a semiconductor chip, a test for confirmation of operation of the flipflops themselves must be performed. Since a test of each flipflop requires a large circuit scale by a test circuit, a plurality of flipflops are combined to form a shift register for testing and a shifting operation of the shift register is confirmed to effect a test of the component flipflops. Generally, in a semiconductor integrated circuit formed on a semiconductor chip, from the point of view of a designing efficiency, basic circuits such as flipflops which compose the circuit are registered as cells in a library and layout designing is performed by citing the cells. The cells of flipflops are divided into cells of the LSSD type and cells of the MUX-D type.

A cell of a flipflop of the LSSD type includes a first selector for selecting one of a system clock and a first clock (A clock) in response to a selection signal, an invertor for inverting the system clock, a second selector for selecting one of an output signal of the invertor and a second clock (B clock) in response to the selection signal, a third selector for selecting one of a data signal and a scanning signal in response to the selection signal, a first latch circuit formed from a transmission gate or a like element for inputting an output of the fist selector as a clock and latching an output signal of the third selector at a rising edge of the clock, and a second latch circuit formed from a transmission gate or a like element for inputting an output of the second selector as a clock and latching an output of the first latch circuit.

Further, an output of the flipflop of the LSSD type is inputted as a scanning signal to another flipflop in the following stage while the system clock, A clock and B clock are inputted commonly to construct a shift register composed of a plurality of shift register, and a scanning signal is inputted from the outside to the top one of the flipflops of the shift register to form a register.

On the other hand, a cell of the MUX-D type includes an invertor for inverting a system clock in response to a selection signal, a fourth selector for selecting one of a data signal and a scanning signal in response to the selection signal, a third latch circuit formed from a transmission gate or a like element for inputting the system clock as a clock and latching an output signal of the fourth selector at a rising edge of the clock, and a fourth latch circuit formed from a transmission gate or a like element for inputting an output signal of the invertor as a clock and latching an output of the third latch circuit. Further, an output of the flipflop of the MUX-D type is inputted as a scanning signal to another flipflop in the following stage while the system clock is inputted commonly to construct a shift register composed of a plurality of flipflops, and a scanning signal is inputted from the outside to the top one of the flipflops of the shift register to form a register.

However, in a conventional semiconductor integrated circuit, a shift register is composed only of flipflops of the LSSD type or only of flipflops of the MUX-D type, but not composed of both of flipflops of the LSSD type and flipflops of the MUX-D type. Therefore, where flipflops of the LSSD type are adopted, since a test of the shift register is performed using two clocks for exclusive use which are independent of each other, that is, the A clock and the B clock, there is an advantage in that an overlap of periods of pulses of the A clock and the B clock can be eliminated with certainty, and consequently, a malfunction of any flipflop which may be caused by an overlap of periods of pulses does not occur at all and a fault of a timing error does not occur in a scanning operation. However, there is a drawback in that the circuit of flipflops is complicated by circuits of the first to third selectors and wiring lines for the three clocks and the circuit scale of the semiconductor chip becomes large.

In contrast, where flipflops of the MUX-D type are used, while there is an advantage that the circuit scale is smaller than that where flipflops of the LSSD type are used, there is a drawback that, since the system clock and the inverted system clock are used, a timing error is liable to occur in a scanning operation because of an overlap of pulses of the two clocks. As described above, in a conventional semiconductor integrated circuit for which flipflops of only one of the LSSD type and the MUX-D type are used, a scanning circuit which has a reasonable scale and is high in reliability cannot be formed.

SUMMARY OF THE INVENTION

Accordingly, it is an object of the present invention to provide a semiconductor integrated circuit which has a reasonable scale and is high in reliability in a test of flipflops by using flipflops of the LSSD type which use two clocks for exclusive use and flipflops of the MUX-D type which use a single clock in a mixed condition.

In accordance with an aspect of the present invention, there is provided a semiconductor integrated circuit formed on a semiconductor chip, comprising a first shift register including a plurality of first flipflops each including a first latch circuit for latching scanning data in response to a first clock signal and a second latch circuit for latching output data of the first latch circuit in response to an inverted signal of the first clock signal, an output of each of the second latch circuits being inputted as the scanning data to the first flipflop in a next stage, and a second shift register including a plurality of second flipflops each including a third latch circuit for latching a second scanning data in response to a second clock signal and a fourth latch circuit for latching output data of the third latch circuit in response to a third clock signal, an output of each of the fourth latch circuits being inputted as the scanning data to the second flipflop in the following stage.

In accordance with another aspect of the present invention, there is provided a semiconductor integrated circuit formed on a semiconductor chip, comprising a plurality of first flipflops each including a first selector for selecting one of a first clock signal or an inverted signal of the first clock signal and a second clock signal, a second selector for selecting one of the first clock signal or the inverted signal of the first clock signal and a third clock signal, a third selector for selecting one of a first data signal and a first scanning signal, a first latch circuit for latching an output signal of the third selector in response to an output signal of the first selector, and a second latch circuit for latching an output signal of the first latch circuit in response to an output signal of the second selector, and a plurality of second flipflops each including a fourth selector for selecting one of a second data signal and a second scanning signal, a third latch circuit for latching an output signal of the fourth selector in response to a fourth clock signal or an inverted signal of the fourth clock signal, and a fourth latch circuit for latching an output signal of the third latch circuit in response to the fourth clock signal or the inverted signal of the fourth clock signal, a first system clock and first and second test clock signals being inputted commonly as the first, second and third clock signals, respectively, while an output signal of the first flipflop in a prior stage is inputted as the first scanning signal to the first flipflop in a next stage thereby to form a shift register which is composed of the plurality of first flipflops, a second system clock being inputted commonly as the fourth clock signal while an output signal of the second flipflop in the prior stage is inputted as the second scanning signal to the second flipflop in the next stage thereby to form a second shift register which is composed of the plurality of second flipflops.

The above and other objects, features and advantages of the present invention and the manner of realizing them will become more apparent, and the invention itself will best be understood, from a study of the following description and appended claims with reference to the attached drawings showing some preferred embodiments of the invention.

DESCRIPTION OF THE PREFERRED EMBODIMENTS

Figure 1:
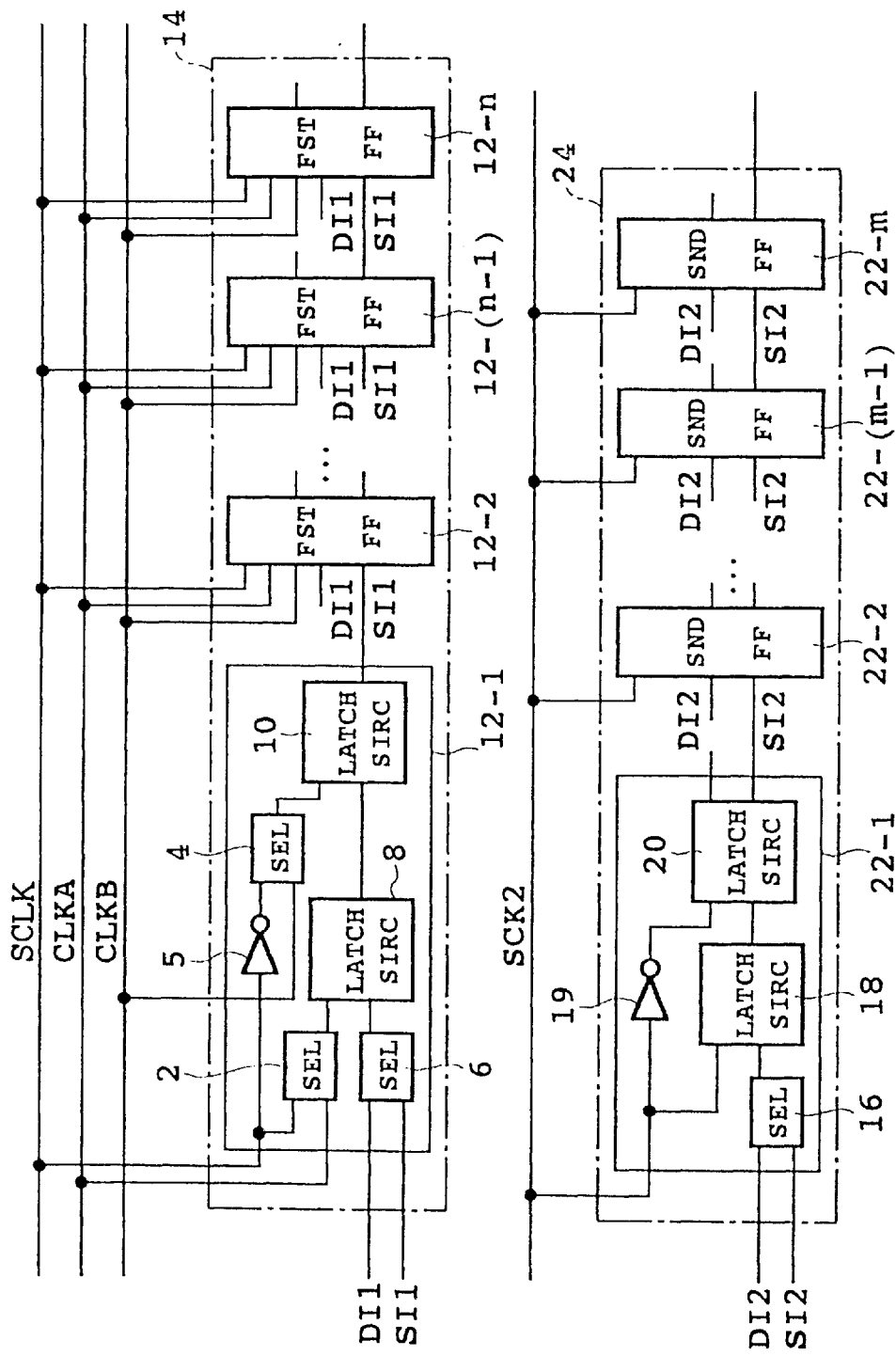
FIG. 1 is a basic block diagram of a semiconductor integrated circuit of the present invention.

FIG. 1 is a basic block diagram of a semiconductor integrated circuit of the present invention.

Referring to FIG. 1, the semiconductor integrated circuit shown includes a first shift register 14 composed of a plurality of first flipflops 12-i (i=1 to n) formed on a semiconductor chip, and a second shift register 24 formed from a plurality of second flipflops 22-j (j=1 to m) formed on the semiconductor chip. Each of the first flipflops 12-i includes first, second and third selectors 2, 4 and 6, and first and second latch circuits 8 and 10. The first selector 2 selects one of first and second clocks. The second selector 4 selects one of an inverted signal of the first clock by an invertor 5 and a third clock. The third selector 6 selects a data signal DI1 or a scanning signal SI1.

The first latch circuit 8 inputs an output signal of the first selector 2 as a clock to latch an output signal of the third selector 6. The second latch circuit 10 inputs an output signal of the second selector 4 as a clock to latch an output signal of the first latch circuit 8. The first shift register 14 inputs an output signal SO of the first flipflop 12-(i−1) (i=2 to n) in a prior stage as a scanning signal SI1 of the first flipflop 12-i in a next stage, and to the first flipflops 12-i (i=1 to n), a first system clock SCK1, a first test clock CLKA and a second test clock CLKB are inputted commonly as first, second and third clocks, respectively. Each of the second flipflops 12-j includes a fourth selector 16 and third and fourth latch circuits 18 and 20. The fourth selector 16 selects a data signal DI2 or a scanning signal SI2.

The third latch circuit 18 inputs a fourth clock as a clock to latch an output signal of the fourth selector 16. The fourth latch circuit 20 inputs an inverted signal of the forth clock by an invertor 19 as a clock to latch an output signal of the third latch circuit 18. The second shift register 24 inputs an output signal SO of the second flipflop 22-(j−1) (j=2 to m) in the prior stage as a scanning signal SI2 of the second flipflop 22-j in the next stage while a second system clock SCK2 is inputted commonly as a fourth clock to the second flipflops 22-j (j=1 to m).

With the construction described above, the first shift register 14 latches, upon testing, the scanning signal SI1 in synchronism with the first test clock CLKA and outputs the latched scanning signal SI1 in synchronism with the second test clock CLKB thereby to perform a shifting operation. Since the first shift register 14 performs a latching operation based on the first test clock CLKA and the second test clock CLKB which are independent of each other, it does not suffer from a malfunction which is caused by a timing error by controlling the first test clock CLKA and the second test clock CLKB so that periods of pulses of them may not overlap with each other. However, since the first shift register 14 has a comparatively large circuit scale, it should be applied, for example, where a clock skew is large. The second shift register 24 latches, upon testing, the scanning signal SI2 in synchronism with a rising edge of the second system clock SCK2 or the like and outputs the latched scanning signal SI2 in synchronism with a falling edge of the second system clock SCK2 or the like thereby to perform a shifting operation.

Since the second shift register 24 performs a latching operation based on the second system clock SCK2, although it is liable to suffer from a timing error by a clock skew, it can be formed in a comparatively small circuit scale. The second shift register 24 should be applied, for example, where a clock skew is small. Consequently, by selecting flipflops based on a clock skew or a circuit scale of a register when the register is to be formed, an optimum semiconductor integrated circuit can be realized.

Figure 2:
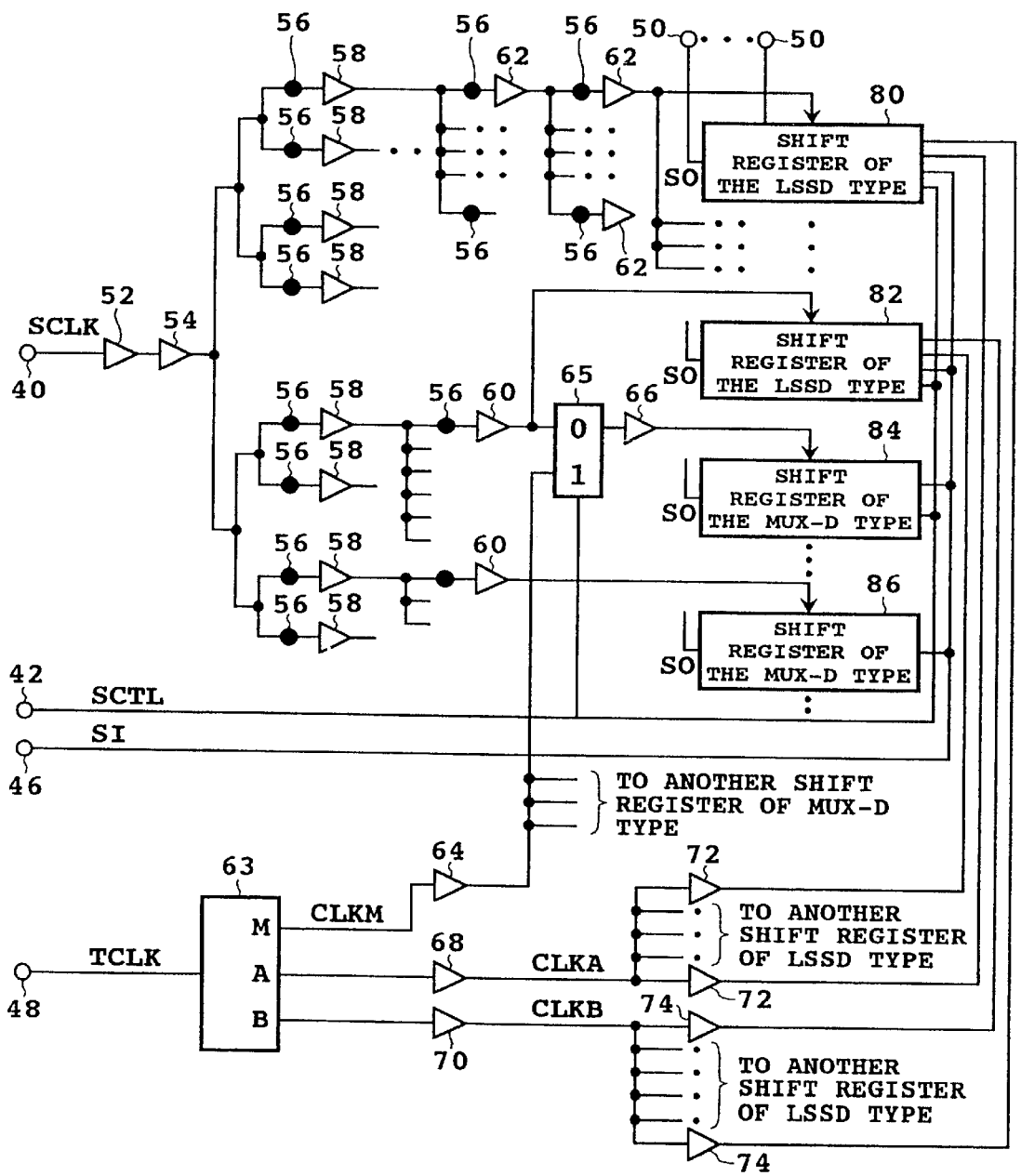
FIG. 2 is a block diagram of a semiconductor integrated circuit according to an embodiment of the present invention.

FIG. 2 is a block diagram of a semiconductor integrated circuit according to an embodiment of the present invention. Referring to FIG. 2, the semiconductor integrated circuit shown is formed on a single semiconductor chip and includes a system clock input terminal 40, a scanning control signal input terminal 42, a scanning data input terminal 46, a test clock input terminal 48, a plurality of scanning output terminals 50, a plurality of delay elements 56, a plurality of drivers 52, 54, 58, 60, 62, 64, 66, 68, 70 and 72, shift registers 80 and 82 of the LSSD type, and shift registers 84 and 86 of the MUX-D type as well as a combination circuit, a synchronous RAM circuit and so forth.

The system clock input terminal 40 is a terminal for inputting a system clock SCLK. It is to be noted that, where a plurality of system clocks SCLK are required, a plurality of system clock input terminals 40 are provided. The scanning control signal input terminal 42 is a terminal for inputting a scanning control signal SCTL for designating one of actual operation and testing of the semiconductor integrated circuit, and for example, the high level designates testing whereas the low level designates actual operation. The scanning data input terminal 46 is a terminal for inputting a scanning signal SI upon testing, and the scanning signal SI is inputted, for example, by an LSI tester. It is to be noted that a plurality of such scanning data input terminals 46 may be provided individually for different types such as the LSSD type and the MUX type. The test clock input terminal 48 is a terminal for inputting a test clock TCLK upon testing, and the test clock TCLK is inputted, for example, by an LSI tester.

The scanning output terminals 50 are terminals for outputting an output signal SO. For example, upon testing, the scanning output terminals 50 are connected to an LSI tester, and the levels of output signals at a strobe point are measured and compared with expected values to discriminate a failure of any of the flipflops which form the shift registers 80, 82, 84 and 86. The driver 52 is a main clock driver for system operation for reducing a clock skew. The driver 54 is a global clock driver for system operation provided between the output side of the driver 52 for reduction of a clock skew and a clock wiring line. The drivers 58, 60 and 62 are global clock drivers for system operation provided between the output side of the delay elements 56 and the clock wiring line to reduce a clock skew. The delay elements 56 are provided for absorbing a skew caused by a load imbalance when the system clock SCLK is distributed to the individual blocks.

A clock generation circuit 63 produces first, second and third test clocks CLKA, CLKB and CLKM from the test clock TCLK. The third test clock CLKM has a clock period equal to that of the test clock TCLK and, for example, is a through clock of the test clock TCLK. The first test clock CLKA is a clock which has a clock period equal to that of the test clock TCLK and has a fixed pulse width from a rising edge of the test clock TCLK. The second test clock CLKB is a clock which has a clock period equal to that of the test clock TCLK and has a fixed pulse width from a falling edge of the test clock TCLK. By suitably setting the pulse widths of the first and second test clocks CLKA and CLKB, an otherwise possible overlap of periods of pulses between the two test clocks CLKA and CLKB is prevented with a large margin.

The driver 64 is a global clock driver for shifting operation of scanning for reducing a clock skew when the third test clock CLKM is distributed to the shift register 84 of the MUX-D type. A selector 65 selects one of the system clock SCLK and the third test clock CLKM in response to the scanning control signal SCTL. For example, when the scanning control signal SCTL has the high level, the selector 65 selects the third test clock CLKM, but when the scanning control signal SCTL has the low level, the selector 65 selects the system clock SCLK. The driver 66 is a global clock driver for shifting operation of scanning for reducing a clock skew by fan-in of the flipflops which compose the shift register 84 of the MUX-D type.

The drives 68 and 70 are provided for the first and second test clocks CLKA and CLKB, respectively, and are global clock drivers for shifting operation of scanning which play a role similar to that of the driver 64. The drivers 72 and 74 are provided for the first and second test clocks CLKA and CLKB, respectively, and are local clock drivers for shifting operation of scanning which play a role similar to that of the driver 66. In the present embodiment, four types of shift registers of the shift register 80 of the LSSD type (type 1), the shift register 82 of the LSSD type (type 2), the shift register 84 of the MUX-D type (type 3) and the shift register 86 of the MUX-D type (type 4) are provided.

The shift register 80 of the type 1 is of the LSSD type wherein the system clock SCLK distributed from the driver 62 is not used commonly with the other shift register 82, 84 and 86. The shift register 82 of the type 2 is of the LSSD type wherein the system clock SCLK distributed from the driver 60 is used commonly with the shift register 84 of the MUX-D type. The shift register 84 of the type 3 is of the MUX-D type wherein the system clock SCLK distributed from the driver 60 is used commonly with the shift register 82 of the LSSD type. The shift register 86 of the type 4 is of the MUX-D type wherein the system clock SCLK distributed from the driver 60 is not used commonly with the other shift registers 80, 82 and 84.

Since the shift register 80 uses, upon testing, the two test clocks CLKA and CLKB which are independent of each other, a timing error is not liable to occur. Besides, upon actual operation, since the shift register 80 does not receive distribution of the system clock SCLK from the selector 65 but uses the system clock SCLK which is an output of the driver 62, it is advantageous in that the delay time of the system clock SCLK is small. However, the shift register 80 is disadvantageous in that it has a comparatively large circuit scale. The shift register 82 of the type 2 is advantageous in that, upon testing, a timing error is not liable to occur since it uses the two test clocks CLKA and CLKB which are independent of each other. However, since, different from the shift register 80 of the type 1, the shift register 82 uses the system clock SCLK, which is an output of the driver 60, commonly with the shift register 84 of the MUX-D type, it is disadvantageous in that care must be taken of a delay time of the system clock SCLK and it has a comparatively large circuit scale.

The shift register 84 of the type 3 is advantageous in that it has a circuit scale smaller than those of the shift registers 80 and 82. However, it is disadvantageous in that, since it uses a single clock of an output of the selector 65, a timing error is liable to occur comparing with the shift registers 80 and 82. However, since the third test clock CLKM is distributed to the shift register 84 using the selector 65 to perform a test of the shift register 84, a clock skew is reduced comparing with an alternative case wherein the system clock SCLK is used upon testing, and consequently, the shift register 84 is less liable to suffer from a timing error. On the other hand, since, upon actual operation, the system clock SCLK is outputted through the selector 65, a delay of the output may possibly be caused in a critical path or the like by a delay of the system clock SCLK.

The shift register 86 of the type 4 is advantageous in that it has a smaller circuit scale than the shift registers 80 and 82, but is disadvantageous in that, since, upon testing, the system clock SCLK which is an output of the driver 60 is used, a timing error is liable to be caused by a clock skew comparing with the shift registers 80 and 82.

Figure 3:
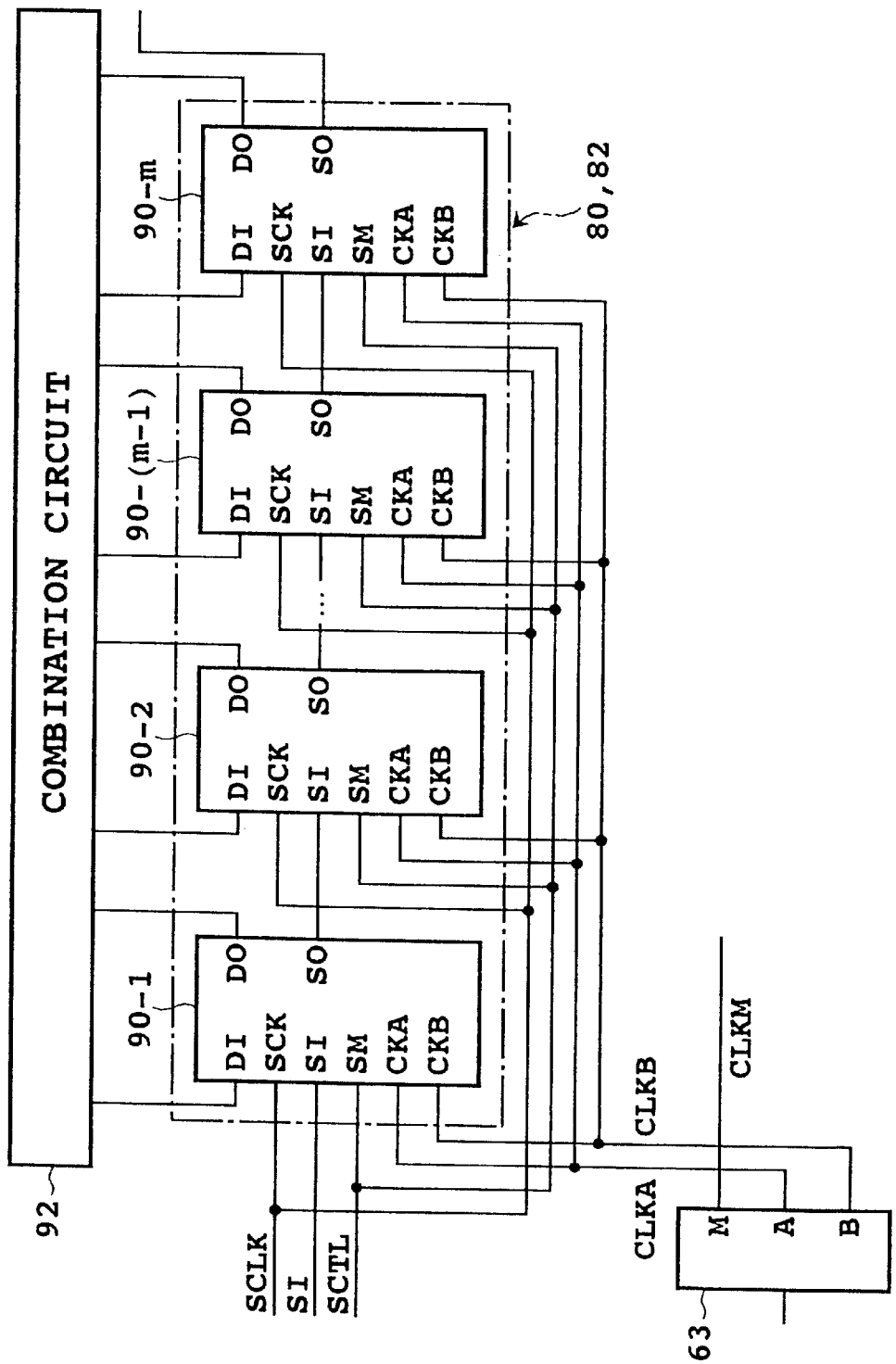
FIG. 3 is a block diagram of a shift register of the LSSD type shown in FIG. 2.

FIG. 3 is a block diagram showing a construction of the shift registers of the LSSD type shown in FIG. 2. Referring to FIG. 3, each of the shift registers 80 and 82 of the LSSD type is composed of flipflops 90-i (i=1 to n) of the LSSD type. The scanning signal SI is inputted to a terminal SI of the flipflop 90-1 in the first stage, and is outputted from a terminal SO of the flipflop 90-n in the last stage to a scanning output terminal 50. Each of the flipflops 90-i has terminals DI, SCK, SI, SM, CKA, CKB, DO and SO, and includes an invertor not shown, first to third selectors not shown and first and second latch circuits not shown.

The terminal DI is a terminal for inputting data from a combination circuit 92 or the like. The terminal SCK is a clock terminal for inputting the system clock SCLK. The terminal SI is a terminal for inputting the scanning signal SI. The terminal SM is a terminal for inputting the scanning control signal SCTL. The terminals CKA and CKB are clock terminals for inputting the first and second test clocks CLKA and CLKB, respectively. The terminal DO is a terminal for outputting data or the like to the combination circuit 92 or the like. The terminal SO is a terminal for outputting the scanning signal SI. The invertor inverts the system clock SCLK. The first selector selects one of the system clock SCLK and the first test clock CLKA in response to the scanning control signal SCTL. For example, when the scanning control signal SCTL has the high level, the first selector selects the first test clock CLKA, but when the scanning control signal SCTL has the low level, the first selector selects the system clock SCLK.

The second selector selects one of the inverted signal of the system clock SCLK, which is an output signal of the invertor, and the second test clock CLKB in response to the scanning control signal SCTL. For example, when the scanning control signal SCTL has the high level, the second selector selects the second test clock CLKB, but when the scanning control signal SCTL has the low level, the second selector selects the inverted signal of the system clock SCLK. The third selector selects one of the data signal DI and the scanning signal SI in response to the scanning control signal SCTL. For example, when the scanning control signal SCTL has the high level, the third selector selects the scanning signal SI, but when the scanning control signal SCTL has the low level, the third selector selects the data signal DI.

The first latch circuit is a transmission gate or a like element which latches, when the clock of the output of the first selector exhibits a change to the high level, the output signal of the third selector and outputs the latched signal. The second latch circuit is a transmission gate or a like element which latches, when the clock of the output of the second selector exhibits a change to the high level, the output of the first latch circuit and outputs the latched signal from the terminals DO and SO. Accordingly, upon testing, each of the flipflops 90-i latches the scanning data SI at a rising edge of the first test clock CLKA and outputs the scanning data SI to the terminal SO at a rising edge of the second test clock SCLB, but upon actual operation, it latches the data DI at a rising edge of the system clock SCLK and outputs the data signal DI at a falling edge of the system clock SCLK from the terminal DO.

Figure 4:
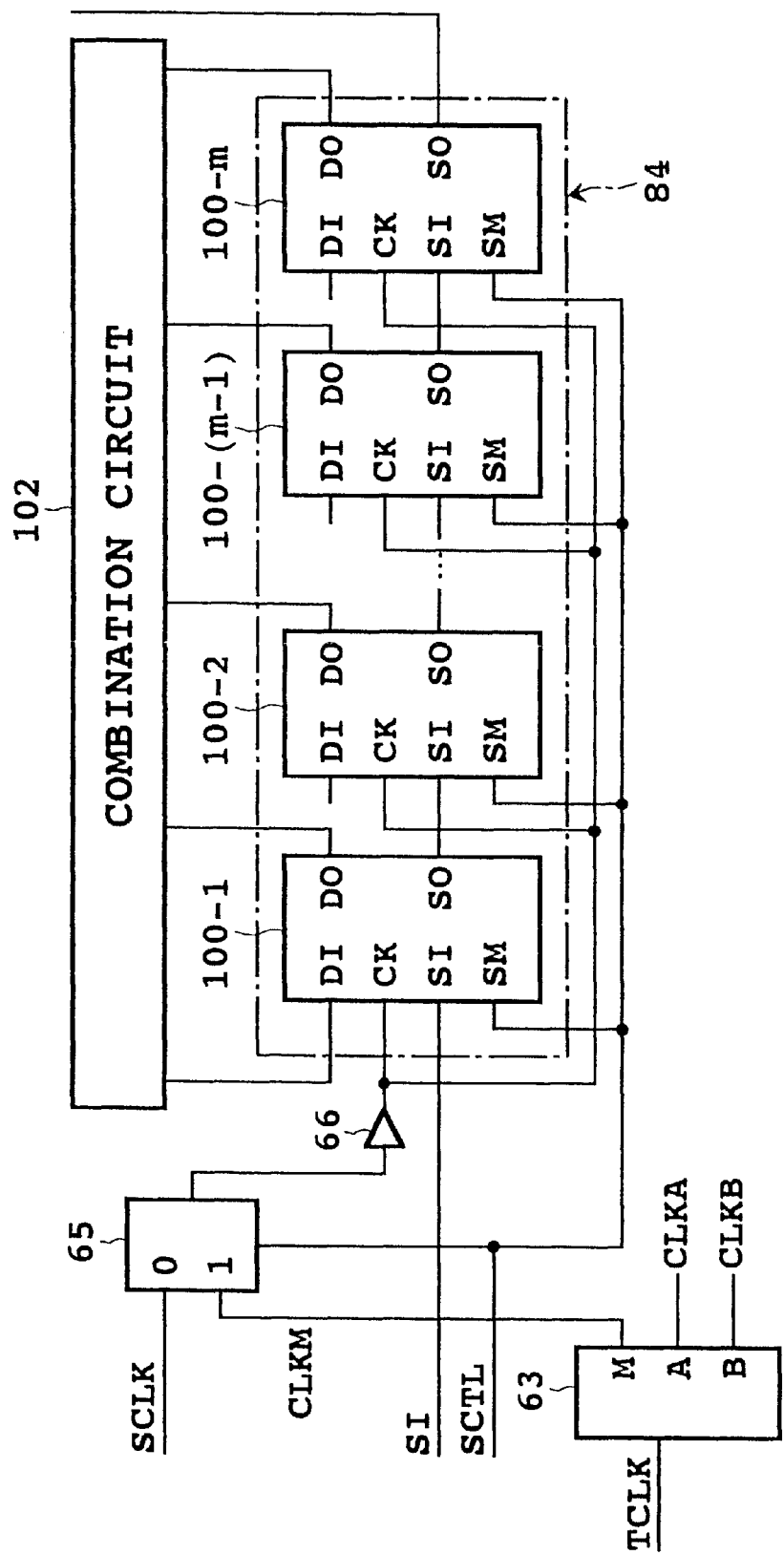
FIG. 4 is a block diagram of a shift register of the MUX-D type shown in FIG. 2.

FIG. 4 is a block diagram of the shift register 84 of the MUX-D type shown in FIG. 2. Referring to FIG. 4, the shift register 84 of the MUX-D type shown in FIG. 2 is composed of flipflops 100-j (j=1 to m) of the MUX-D type, and the scanning signal SI is inputted to a terminal SI of the flipflop 100-1 in the first stage and is outputted from a terminal SO of the flipflop 100-m in the last stage to a scanning output terminal 50. Each of the flipflops 100-j has terminals DI, CK, SI, SM, DO and SO and includes an invertor not shown, a fourth selector not shown and third and fourth latch circuits not shown. The terminal DI is a terminal for inputting data from a combination circuit 102 or the like. The terminal CK is a clock terminal for inputting a clock of an output of the selector 65 through the driver 66. The terminal SI is a terminal for inputting the scanning signal SI. The terminal SM is a terminal for inputting the scanning control signal SCTL. The terminal DO is a terminal for outputting data to the combination circuit 102 or the like. The terminal SO is a terminal for outputting the scanning signal SI. The invertor inverts the clock inputted to the terminal CK.

The fourth selector selects one of the data signal inputted to the terminal DI and the scanning signal inputted to the terminal SI in response to the scanning control signal SCTL. For example, when the scanning control signal SCTL has the high level, the fourth selector selects the scanning signal SI, but when the scanning control signal SCTL has the low level, the fourth selector selects the data signal DI. The third latch circuit latches, when the clock of the terminal CK exhibits a change to the high level, the output signal of the fourth selector and outputs the latched signal. The fourth latch circuit latches, when the clock of the output of the invertor exhibits a change to the high level, the output of the third latch circuit and outputs the latched signal from the terminals DO and SO. Accordingly, upon testing, each of the flipflops 100-j latches the scanning data SI at a rising edge of the third test clock CLKM and outputs the scanning signal SI to the terminal SO at a falling edge of the third test clock CLKM, but upon actual operation, it latches the data DI at a rising edge of the system clock SCLK and outputs the data DI at a falling edge of the system clock SCLK from the terminal DO. While the present embodiment is constructed such that the inputs and the outputs to and from the flipflops 90-i (i=1 to n) and the flipflops 100-j (j=1 to m) are outputted from or inputted to the combination circuits 92 and 102, where the flipflops 90-i or the flipflops 100-j form a sequence circuit such as a register or a counter, an output of the sequence circuit is outputted to the terminal DI of the flipflop 90-(i+1) or the flipflop 100-(j+1) or the like. While the construction of the shift register 86 of the MUX-D type is same as that of the shift register 84, the shift register 86 is different from the shift register 84 in that it does not input the output of the selector 65 but inputs only the system clock SCLK.

In the following, a designing method for and operation of the semiconductor integrated circuit of FIG. 2 are described.

(a) Designing of the Semiconductor Integrated Circuit.

Relationships among the function blocks and internal operations of the function blocks are determined based on specifications determined by system designing of the semiconductor integrated circuit, and each of the function blocks is composed of a combination of basic gates. Electronic circuits on the transistor level and characteristics of the elements are determined, and from the characteristics and the specifications of the elements, wiring line delays of clock wiring lines and so forth, arrangement of and transistors to be used for the drivers 52, 54, 58, 60, 62, 64, 66, 68, 70 and 72, clock generation circuit 63, selector 65 and delay elements 56, cells to be used for the combination circuits 92 and 102, and cells of the flipflops (of the LSSD type or the MUX-D type) are determined.

Here, the following criteria may be used for determination of whether a cell of a flipflop of the LSSD type or the MUX-D type should be used.

(T1) Where the shift register 80 of the LSSD type should be used:

The shift register 80 is adopted where, if a shift register of the MUX-D type is used, then a large clock skew occurs upon testing and a timing error is liable to occur, for example, where the bit number of the shift register is comparatively large.

(T2) Where the shift register 82 of the LSSD type should be used:

The shift register 82 is used where such a larger number of flipflops that they must be divided into the shift register 82 and the shift register 84 of the MUX-D type and besides are involved in a block and besides it is required that the time after the system clock SCLK exhibits a transition until the output of the terminal DO of the divided flipflops exhibits a transition be within a fixed time in specification (critical path). The reason why the shift register 82 is used for a critical path is that, if the flipflops are formed from the shift register 84 of the MUX-D type, then since, upon operation, the system clock SCLK passes through the selector 65 and is inputted to the flipflops, a delay of the system clock SCLK matters.

(T3) Where the shift register 84 of the MUX-D type should be used:

The shift register 84 of the MUX-D type is adopted where the shift register 82 of the LSSD type is involved in the same block and a timing error is liable to be caused by a clock skew, for example, where the bit number of the shift register 84 is small or the like.

(T4) Where the shift register 86 of the MUX-D type should be used:

The shift register 86 of the MUX-D type is adopted where the shift register 82 of the LSSD type is not involved in the same block and a timing error is not liable to be caused by a clock skew, for example, where the bit number of the shift register 86 is small or the like. Using cells of the LSSD type, cells of the MUX-D type and so forth registered in a cell library, arrangement and wiring of the semiconductor circuit shown in FIG. 2 are performed, and arrangement and wiring of the shift registers 80 and 82 of the LSSD type and arrangement and wiring of the shift registers 84 and 86 of the MUX-D type and so forth are performed manually or using automatic arrangement and wiring tools, and a master or the like is produced to produce a chip of the semiconductor integrated circuit. (b) Test of the Semiconductor Integrated Circuit.

A test of the semiconductor integrated circuit shown in FIG. 2 is performed, using an IC tester or the like, by applying the system clock SCLK to the terminal 40, applying the scanning control signal SCTL, for example, the high level, to the terminal 42, applying the scanning signal SI to the terminal 46 in synchronism with the clocks TCLK and SCLK and applying the test clock TCLK to the terminal 48. The system clock SCLK applied to the terminal 40 is distributed by the drivers 52, 54, 58, 60 and 62 and inputted to the shift registers 80 and 82 of the LSSD type and the shift registers 84 and 86 of the MUX-D type. The scanning control signal SCTL inputted to the terminal 42 is inputted to the selector 65, the shift registers 80 and 82 of the LSSD type and the shift registers 84 and 86 of the MUX-D type. The scanning signal SI inputted to the terminal 46 is inputted to the terminals SI of the flipflops 90-1 and 100-1 in the first stage of the shift registers 80 and 82 of the LSSD type and the shift registers 84 and 86 of the MUX-D type.

The test clock TCLK inputted to the terminal 48 is inputted to the clock generation circuit 63, and, for example, the test clock TCLK passes through the clock generation circuit 63 and is outputted as the third test clock CLKM from the terminal M of the clock generation circuit 63 while the first test clock CLKA of a pulse of a fixed width from a rising edge of the test clock TCLK is outputted from the terminal A and the second test clock CLKB of a pulse of a fixed width from a falling edge of the test clock TCLK is outputted from the terminal B. The selector 65 selects the third test clock CLKM and outputs it to the driver 66. The driver 66 distributes the third test clock CLKM to the shift register 84 of the MUX-D type.

The drivers 68 and 72 distribute the first test clock CLKA to the shift registers 80 and 82 of the LSSD type. The drivers 70 and 74 distribute the second test clock CLKB to the shift registers 80 and 82 of the LSSD type. Each of the shift registers 80 and 82 of the LSSD type latches the scanning signal SI at a rising edge of the first test clock CLKA and outputs the scanning signal SI at a falling edge of the second test clock CLKB from the signal SO so that the scanning signal SI is shifted one by one bit in synchronism with the test clock TCLK. The shift register 84 of the MUX-D type latches the scanning signal SI at a rising edge of the third test clock CLKM and outputs the scanning signal SI at a falling edge of the third test clock CLKM from the signal SO so that the scanning signal SI is shifted one by one bit in synchronism with the test clock TCLK. In this instance, since the shift register 84 of the MUX-D type performs a shifting operation using the third test clock CLKM while the third test clock CLKM is not distributed to the shift register 82 of the LSSD type, a timing error by a clock skew is less liable to occur.

The shift register 86 of the MUX-D type latches the scanning signal SI at a rising edge of the system clock SCLK and outputs the scanning signal SI at a falling edge of the system clock SCLK from the signal SO so that the scanning signal SI is shifted one by one bit in synchronism with the system clock SCLK. In this instance, since the shift register 86 of the MUX-D has a construction wherein a timing error by a clock skew is less liable to occur, a timing error is not liable to occur and the circuit construction is simple. The output signal SO outputted from the terminal SO is measured in logic level at a strobe point by an IC tester or the like, and the thus measured logic level is compared with a pattern of an expected value to effect diagnosis of a failure of each of the shift registers 80 and 82 of the LSSD type and the shift registers 84 and 86 of the MUX-D type.

According to the embodiment described above, since the shift registers 80 and 82 of the LSSD type and the shift registers 84 and 86 of the MUX-D type can be provided in a mixed condition on the semiconductor chip, optimum flipflops can be selected depending upon such factors as the number of bits of the shift register, a critical path/non-critical path, a circuit scale and so forth, and optimization of the chip size can be achieved and a timing error upon testing can be prevented efficiently.

According to the present invention, since a first shift register formed from first flipflops and a second shift register formed from second flipflops can be provided in a mixed condition, optimum flipflops can be selected depending upon such factors as the number of bits of the shift register, a critical path/non-critical path, a chip size and so forth, and optimization of the chip size can be achieved and a timing error upon testing can be prevented efficiently.

What is claimed is:

1. A semiconductor integrated circuit formed on a semiconductor chip, comprising:

a first shift register including a plurality of first flipflops each including a first latch circuit for latching a first scanning data in response to a first clock signal and a second latch circuit for latching output data of said first latch circuit in response to an inverted signal of the first clock signal, an output of each of the second latch circuits being inputted as the first scanning data to the first flipflop in a next stage; and a second shift register including a plurality of second flipflops each including a third latch circuit for latching a second scanning data in response to a second clock signal, which differs from the first clock signal and an inversion of the first clock signal, and a fourth latch circuit for latching output data of said third latch circuit in response to a third clock signal, an output of each of the fourth latch circuits being inputted as the second scanning data to the second flipflop in the next stage.

2. A semiconductor integrated circuit according to claim 1, further comprising:

a clock generation circuit for generating at least one test clock signal from a predetermined clock signal; and a selector for selecting one of a system clock and the test clock signal generated by said clock generation circuit as the first clock signal.

3. A semiconductor integrated circuit according to claim 2, wherein said clock generation circuit generates the second clock signal and the third clock signal as the test clock signals.

4. A semiconductor integrated circuit according to claim 2, further comprising a driver for supplying the first clock signal outputted from said selector to said first shift register.

5. A semiconductor integrated circuit formed on a semiconductor chip, comprising:

a plurality of first flipflops each including a first selector for selecting one of a first clock signal or an inverted signal of the first clock signal and a second clock signal, a second selector for selecting one of the first clock signal or the inverted signal of the first clock signal and a third clock signal, a third selector for selecting one of a first data signal and a first scanning signal, a first latch circuit for latching an output signal of said third selector in response to an output signal of said first selector, and a second latch circuit for latching an output signal of said first latch circuit in response to an output signal of said second selector; and a plurality of second flipflops each including a fourth selector for selecting one of a second data signal and a second scanning signal, a third latch circuit for latching an output signal of said fourth selector in response to a fourth clock signal or an inverted signal of the fourth clock signal, and a fourth latch circuit for latching an output signal of said third latch circuit in response to the fourth clock signal or the inverted signal of the fourth clock signal;

a first system clock, and first and second test clock signals, being inputted commonly as the first, second and third clock signals, respectively, while an output signal of the first flipflop in a prior stage is inputted as the first scanning signal to the first flipflop in a next stage thereby to form a shift register including said plurality of first flipflops;

a second system clock being inputted commonly as the fourth clock signal while an output signal of the second flipflop in the prior stage is inputted as the second scanning signal to the second flipflop in the next stage thereby to form a second shift register including said plurality of second flipflops.

6. A semiconductor integrated circuit formed on a semiconductor chip, comprising:

a plurality of first flipflops each including a first selector for selecting one of a first clock signal or an inverted signal of the first clock signal and a second clock signal, a second selector for selecting one of the first clock signal or the inverted signal of the first clock signal and a third clock signal, a third selector for selecting one of a first data signal and a first scanning signal, a first latch circuit for latching an output signal of said third selector in response to an output signal of said first selector, and a second latch circuit for latching an output signal of said first latch circuit in response to an output signal of said second selector;

a plurality of second flipflops each including a fourth selector for selecting one of a second data signal and a second scanning signal, a third latch circuit for latching an output signal of said fourth selector in response to a fourth clock signal or an inverted signal of the fourth clock signal, and a fourth latch circuit for latching an output signal of said third latch circuit in response to the fourth clock signal or the inverted signal of the fourth clock signal;

a fifth selector for selecting one of a fifth clock signal and a sixth clock signal;

a first system clock and a first test clock signal being inputted as the fifth and sixth clock signals to said fifth selector, respectively;

the first system clock, second, and third clock signals being inputted commonly as the first, second, and third clock signals, respectively, while an output signal of the first flipflop in a prior stage is inputted as the first scanning signal to the first flipflop in a next stage thereby to form a first shift register including said plurality of first flipflops; and an output signal of said fifth selector being inputted commonly as the fourth clock signal while an output signal of the second flipflop in the prior stage is inputted as the second scanning signal to the second flipflop in the next stage thereby to form a second shift register including said plurality of second flipflops.

7. A semiconductor integrated circuit formed on semiconductor chip, comprising:

a first shift register including a plurality of first type flipflops, each of the first type flipflops including a first latch and a second latch;

a second shift register including a plurality of second type flipflops; each of the second type flipflops including a third latch and a fourth latch, wherein the second type of flipflops are different than the first type of flipflops; and a clock generation circuit to output first, second, and third clock signals, wherein the first clock signal controls the first and second latch, the second clock signal controls the third latch, and the third clock signal, different than the second clock signal, controls the fourth latch, such that the fourth latch latches an output of the third latch in response to the third clock signal.

* * * * *